(12) United States Patent
Ashiya et al.

(10) Patent No.: US 6,924,964 B2
(45) Date of Patent: Aug. 2, 2005

(54) RELAY DEVICE AND RELAY DEVICE MOUNTING STRUCTURE

(75) Inventors: Hiroyuki Ashiya, Haibara-gun (JP); Masataka Suzuki, Haibara-gun (JP); Yoshiyuki Tanaka, Haibara-gun (JP); Shingo Matsuura, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 433 days.

(21) Appl. No.: 10/316,026

(22) Filed: Dec. 11, 2002

(65) Prior Publication Data

US 2003/0109170 A1 Jun. 12, 2003

(30) Foreign Application Priority Data

Dec. 11, 2001 (JP) ..................................... P2001-377219

(51) Int. Cl.$^7$ .............................................. H01H 47/00
(52) U.S. Cl. ...................................................... 361/160
(58) Field of Search ........................................ 361/160

(56) References Cited

U.S. PATENT DOCUMENTS

| | | | | |
|---|---|---|---|---|
| 4,074,342 A | * | 2/1978 | Honn et al. .................. | 361/779 |
| 4,814,944 A | | 3/1989 | Sagawa et al. | |
| 5,567,984 A | * | 10/1996 | Zalesinski et al. .......... | 257/697 |
| 5,730,932 A | | 3/1998 | Sarkhel et al. | |
| 6,555,052 B2 | * | 4/2003 | Soga et al. .................. | 420/560 |
| 6,765,805 B2 | * | 7/2004 | Naruse et al. .............. | 361/803 |
| 6,774,490 B2 | * | 8/2004 | Soga et al. .................. | 257/772 |

FOREIGN PATENT DOCUMENTS

EP 0 917 196 A2 5/1999

OTHER PUBLICATIONS

Japanese Abstract No. 10289641, dated Oct. 27, 1998.
Japanese Abstract No. 06052911, dated Feb. 25, 1994.
Japanese Abstract No. 10056250, dated Feb. 24, 1998.

* cited by examiner

Primary Examiner—Stephen W. Jackson
Assistant Examiner—James A. Demakis
(74) Attorney, Agent, or Firm—Sughrue Mion, PLLC

(57) ABSTRACT

Terminals (11, 13) for electrical connection respectively have front end portions (11b, 13b) to be joined to a wiring board (20) with solder and base end portions (11a, 13a) drawn outside from a cover (7) made of heat-expanding material. In order for the base end portions to absorb stress countering the external force received from the cover subjected to thermal expansion due to the heat generated by an electromagnetic coil (5) by the deflection deformation of the intermediate portions (11c, 13c) of the terminals positioned closer to the cover than the wiring board 20 with the relay device mounted on the wiring board, the terminals are formed with a predetermined length of L' in the extending direction of the terminals so that the length required for necessary flexibility is secured for the intermediate portions.

9 Claims, 4 Drawing Sheets

RELAY DEVICE AND RELAY DEVICE MOUNTING STRUCTURE

BACKGROUND OF THE INVENTION

The present invention relates to a relay device that is mounted on a wiring board with solder and used for making and breaking contacts in a circuit and to a specific relay device mounting structure.

There is a relay device arranged on a power supply line for connecting a battery and an on-board load like a circuit in a vehicle relay box, for example, and used for switching contacts on the power supply line.

Such a relay device is formed such that terminals for making electrical connections to a circuit are drawn outside from a cover for containing a normally open (or closed) type switching contact member, a electromagnetic coil for causing the switching contact member to undergo excitation displacement toward the closed (or open) side and the like.

In the relay device thus constituted, the cover of the relay device is made of synthetic resin such as PBT (Polybutylene Terephthalate) and may undergo thermal expansion because of heat generation from the electromagnetic coil in case where the excitation toward the closed (or open) side of the contact continue for hours in duration.

When the thermal expansion occurs in the cover, there is generated external force of displacing the positions of the base end sides of the terminals drawn outside from the cover by a dimension corresponding to the quantity of the thermal expansion of the cover in a direction perpendicular to the extending direction of the terminals with respect to the positions of the front end sides joined to a wiring board with solder. Moreover, the external force acts on the base end portions of the terminals.

Heretofore, because packaging elements have been joined to wiring boards concerning relay boxes in conventional vehicles with solder using an eutectic (eutectic mixture) of Sb (tin) —Pb (lead), absorption of stress has been attempted without damaging the electrical connections between the terminals and the wiring boards by utilizing the absence of rigidity after hardening by cooling of the eutectic solder itself so as to make the solder absorb the stress countering the external force acting on the base end portions of the terminals at the time the cover thermally expands.

On the other hand, it is increasingly promoted to join packaging elements to wiring boards concerning relay boxes in vehicles of late years with solder made of material without containing Pb in view of the protection of the environment.

However, as solder made of material without containing Pb has extremely high rigidity after hardening by cooling, the adoption of a structure of making the solder absorb stress countering external force acting on the base end portions of terminals when the cover undergoes thermal expansion as before results in not allowing the solder affected by the stress to absorb the stress. Thus, the application of the stress is concentrated on the section between the solder and the wiring board and consequently the solder cake is peeled off the wiring board and alienated, so that the electrical connection between the terminal and the wiring board is damaged.

When terminals are joined to a wiring board with solder made of material without containing Pb in particular, it is needed to find a portion other than the solder in the soldering portion of each terminal with respect to the wiring board, that is, a portion where stress countering external force acting on the base end portion of the terminal at the time a cover undergoes thermal expansion without damaging the electrical connection between the terminal and the wiring board.

An object of the invention made in view of the situation above is to provide a relay device capable of absorbing stress countering external force produced in each terminal by the expansion and contraction of a cover due to heat generated by a heat generating element such as an electromagnetic coil without damaging the electrical connections between terminals and a wiring board, supposing that the front end portions of the respective terminals are joined to the wiring board with solder made of material without containing Pb.

SUMMARY OF THE INVENTION

Another object of the invention is to provide a relay device mounting structure fit for actually mounting a relay device on a wiring board.

In order to solve the aforesaid object, the invention is characterized by having the following arrangement.

(1) A relay device mounting structure comprising:
  a cover made of heat-expanding material for containing a heat generating element;
  a wiring board; and
  a plurality of terminals, base end portions being defined by one ends of the terminals and projecting from different places of the cover, respectively, and front end portions being defined by the other ends of the terminals and being joined to different places on the wiring board with solder which does not contain Pb, respectively,
  wherein the terminals have a length between the base end portions and the front end portions so that stress caused by a displacement between the base end portions due to heat generated by the hear generating element is absorbed at the front end portions by utilizing a predetermined flexibility which the terminals have, and
  wherein the length is determined based a sectional area of the terminal.

(2) The relay device mounting structure according to (1), further comprising a space adjusting projection, wherein the space adjusting projecting is abutted against the wiring board when the terminals are joined to the wiring board so as to provide the terminals of the length between the cover and the wiring board.

(3) The relay device mounting structure according to (2), wherein the space adjusting projection extends from the cover along a terminal extending direction.

(4) The relay device mounting structure according to (2), wherein the space adjusting projection is formed at at least one of the terminals.

(5) The relay device mounting structure according to (4), wherein the space adjusting projection is formed by changing thickness of the terminal.

(6) The relay device mounting structure according to (1), wherein the length is determined based the sectional area and material of the terminal.

(7) The relay device mounting structure according to (1), wherein the heat generating element is an electromagnetic coil for switching contact.

(8) The relay device mounting structure according to (1) further comprising a heat radiating member attached to the terminal between the cover and the wiring board.

(9) The relay device mounting structure according to (8), wherein the heat radiating member is made of simple material whose thermal expansion coefficient is lower than that of the cover, and the heat radiating member is attached to the terminals by passing the terminals through the heat radiating member.

In The present disclosure relates to the subject matter contained in Japanese patent application No. 2001-377219 (filed on Dec. 11, 2002), which is expressly incorporated herein by reference in their entireties.

DETAILED DESCRIPTION OF PREFERRED EMBODIMENTS

Relay devices embodying the invention will now be described by reference to the drawings.

Figure 1:
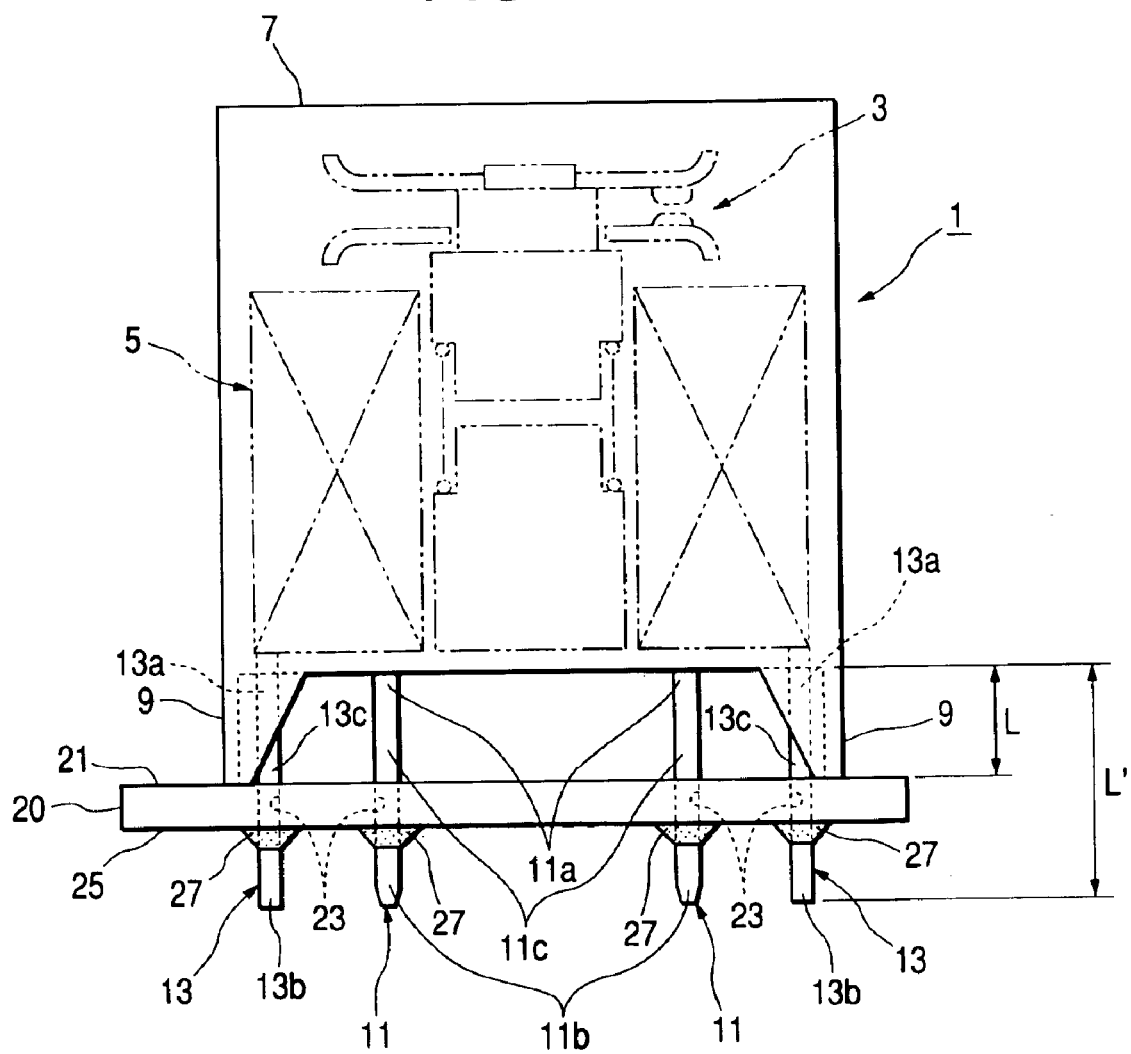
FIG. 1 is a front elevational view of a schematic constitution of a relay device according to a principle governing an embodiment of the invention.

FIG. 1 is a front elevational view of a schematic constitution of a relay device according to a principle governing an embodiment of the invention. A relay device as shown by reference numeral 1 in FIG. 1 is, for example, a vehicle relay box (not shown) mounted on the packaging surface 21 of a wiring board 20.

The relay device 1 has a normally open (or normally closed) make-break contact member 3 as shown by imaginary lines in FIG. 1, an electromagnetic coil 5 (equivalent to a heating generating element as defined in claim) for making the make-break contact member 3 undergo excitation displacement toward the closing (or opening) side, and a plastic cover 7 as shown by a solid line in FIG. 1 and made of PBT (Polybutylene Terephthalate) or the like for containing these component parts. Moreover, space adjusting projections 9 projecting by the length L of legs from the base portion of the cover 7 in the height direction of the cover 7 are formed integrally with the cover 7 at the is respective four corners of the base portion of the cover 7.

Further, base end portions 11a and 11a of two terminals 11 and 11 electrically connected to the make-break contact member 3 and base end portions 13a and 13a of two terminals 13 and 13 electrically connected to the electromagnetic coil 5 project from the base of the cover 7 in the height direction of the cover 7.

The relay device 1 thus constituted according to this embodiment of the invention is mounted on the packaging surface 21 of the wiring board as shown by reference numeral 20 in FIG. 1 through the following procedure.

While the terminals 11 and 13 are being inserted from the side of the packaging surface 21 into through-holes 23 bored in the wiring board 20 in line with the positions of the respective terminals 11 and 13 first, the front ends of the space adjusting projections 9 are brought into contact with the packaging surface 21 and the front end portions 11b and 13b of the terminals 11 and 13 inserted through the through-holes 23 are made to project from a pattern side 25 positioned opposite to the packaging surface 21 of the wiring board 20.

Then the front end portions 11b and 13b of the terminals 11 and 13 projected from the pattern side 25 are joined to proper places of a wiring pattern (not shown) formed on the pattern side 25 with Pb-free solder 27 (equivalent to solder without containing Pb as defined in claim). Thus, the terminals 11 and 13 are electrically connected and simultaneously mechanically fixed to the wiring board 20, so that the relay device 1 is mounted on the wiring board 20.

With the relay device 1 mounted on the wiring board 20, the space adjusting projections 9 of the cover 7 are brought 25 into contact with the packaging surface 21 of the wiring board 20, whereby intermediate portions 11c and 13c (equivalent to the terminal portions positioned closer to the cover than the wiring board as defined in claim) having a length of L equal to the length L of the legs of the space adjusting projections 9 in the height direction of the cover 7 are secured in the portions of the terminals 11 and 13 between the packaging surface 21 and the base of the cover 7.

In the relay device 1 according to this embodiment of the invention, the cover 7 is thermally expanded by the heat generated by the electromagnetic coil 5 when current for making the make-break contact member 3 undergo excitation displacement toward the closing (or opening) side flows into the electromagnetic coil 5 via the terminals 13. Particularly, external force of displacing the base end portions 11a and 13a in a direction perpendicular to the height direction of the cover 7, that is, the extending direction of the base portion of the cover 7, is applied from the base portion thereof to the base end portions 11a and 13a of the terminals 11 and 13 projected from the base portion thereof.

Then a positional deviation occurs in the direction perpendicular to the height direction of the cover 7 between the front end portions 11b and 13b and the base end portions 11a and 13a of the terminals 11 and 13 soldered to the pattern side 25 of the wiring board 20. Moreover, stress countering the external force in order to cancel the positional deviation comes to act on either the sections between the base end portions 11a and 13a and front end portions 11b and 13b of the terminals 11 and 13 or the solder used to join the front end portions 11b and 11b to the pattern side 25 of the wiring board 20.

Therefore, in the relay device 1 according to this embodiment of the invention, the sectional areas of the terminals 11 and 13 in the direction perpendicular to the height direction of the cover 7 so that the stress intensity, in other words, flexibility corresponding to the quantity of positional deviation of the front end portions 11b and 13b from the base end portions 11a and 13a of the terminals 11 and 13 is provided to the intermediate portions 11c and 13c so as to allow the absorption of the stress by the intermediate portions 11c and 13c of the terminals 11 and 13 positioned closer to the cover 7 than the wiring board 20. Moreover, the length L of the intermediate portions 11c and 13c is determined, depending on the (hardness of) material of the terminals 11 and 13.

Incidentally, the length L of the intermediate portions 11c and 13c of the terminals 11 and 13 is set at a relatively greater value as the sectional areas of the terminals 11 and 13 in the direction perpendicular to the height direction of the cover 7 increase and so is the length L thereof as the hardness of the material of the terminals 11 and 13 increases.

Therefore, in case where the material (hardness) of the terminals 11 and 13 is always the same, the length L of the intermediate portions 11c and 13c is determined only in relation to the sectional areas of the terminals 11 and 13.

The length L' of the terminals 11 and 13 in the height direction of the cover 7 is set at a value or greater resulting from adding to the length L of the intermediate portions 11c and 13c the thickness of the wiring board 20 as well as a margin to join with the solder 27 on the pattern side 25 of the wiring board 20.

As is obvious from the description above, according to this embodiment of the invention, the height direction of the cover 7 is equivalent to the extending direction as defined in claim and the length L' of the terminals 11 and 13 in the height direction of the cover 7 is equivalent to the predetermined length in the extending direction as defined in claim and moreover the length L of the intermediate portions 11c and 13c of the terminals 11 and 13 in the height direction of the cover 7 is equivalent to the predetermined length in the extending direction as defined in claim.

The function of the relay device 1 thus constituted according to this embodiment of the invention will now be described.

In the relay device 1 according to this embodiment of the invention as described above, the terminals 11 and 13 are joined to the wiring pattern (not shown) of the pattern side 25 with the solder 27, whereby when the cover 7 is thermally expanded by the heat generated by the electromagnetic coil 5 with the relay device 1 mounted on the wiring board 20, the external force of displacing the base end portions 11a and 13a of the terminals 11 and 13 in the direction perpendicular to the height direction of the cover 7 is applied from the base portion of the cover 7.

The intermediate portions 11c and 13c secured between the packaging surface 21 of the wiring board 20 and the base of the cover 7 undergoes deflection deformation to an extent corresponding to the quantity of positional deviation of the front end portions 11b and 13b from the base end portions 11a and 13a of the terminals 11 and 13 because of the existence of the space adjusting projections 9 of the cover 7, so that stress countering the external force applied from the base of the cover 7 to the base end portions 11a and 13a is absorbed by the intermediate portions 11c and 13c subjected to the deflection deformation.

Consequently, even though there develops external force of relatively displacing the base end portions 11a and 13a from the front end portions 11b and 13b of the terminals 11 and 13 in the direction perpendicular to the height direction of the cover 7, the external force originating in the thermal expansion of the cover 7 due to the heat generated by the electromagnetic coil 5, the stress countering the external force is prevented from acting on the solder 27 used to join the terminals 11 and 13 to the wiring board 20.

Therefore, even though solder made of material having extremely high rigidity after hardening by cooling is used to join the terminals 11 and 13 to the wiring board 20, stress countering the external force produced in the base end portions 11a and 13a of the terminals 11 and 13 with the thermal expansion of the cover 7 surely prevents the solder from peeling off and breaking away from the wiring board 20 and thus prevents the electrical connection of the wiring board 20 to the terminals 11 and 13 from being damaged, whereby it is possible to join the terminals 11 and 13 to the wiring board 20 with the solder made of material without containing Pb.

In the relay device 1 according to this embodiment of the invention, with the relay device 1 mounted on the wiring board 20 by joining the front end portions 11b and 13b of the terminals 11 and 13 to the wiring pattern (not shown) on the pattern side 25 with the solder 27, the space adjusting projections 9 projecting by the length L of the legs from the base portion of the cover 7 in the height direction of the cover 7 are formed at the four corners of the base portion of the cover 7 so as to secure the intermediate portions 11c and 13c having the length L in the height direction of the cover 7 in the portions of the terminals 11 and 13 between the base of the cover 7 of the relay device 1 and the packaging surface 21.

Figure 2:
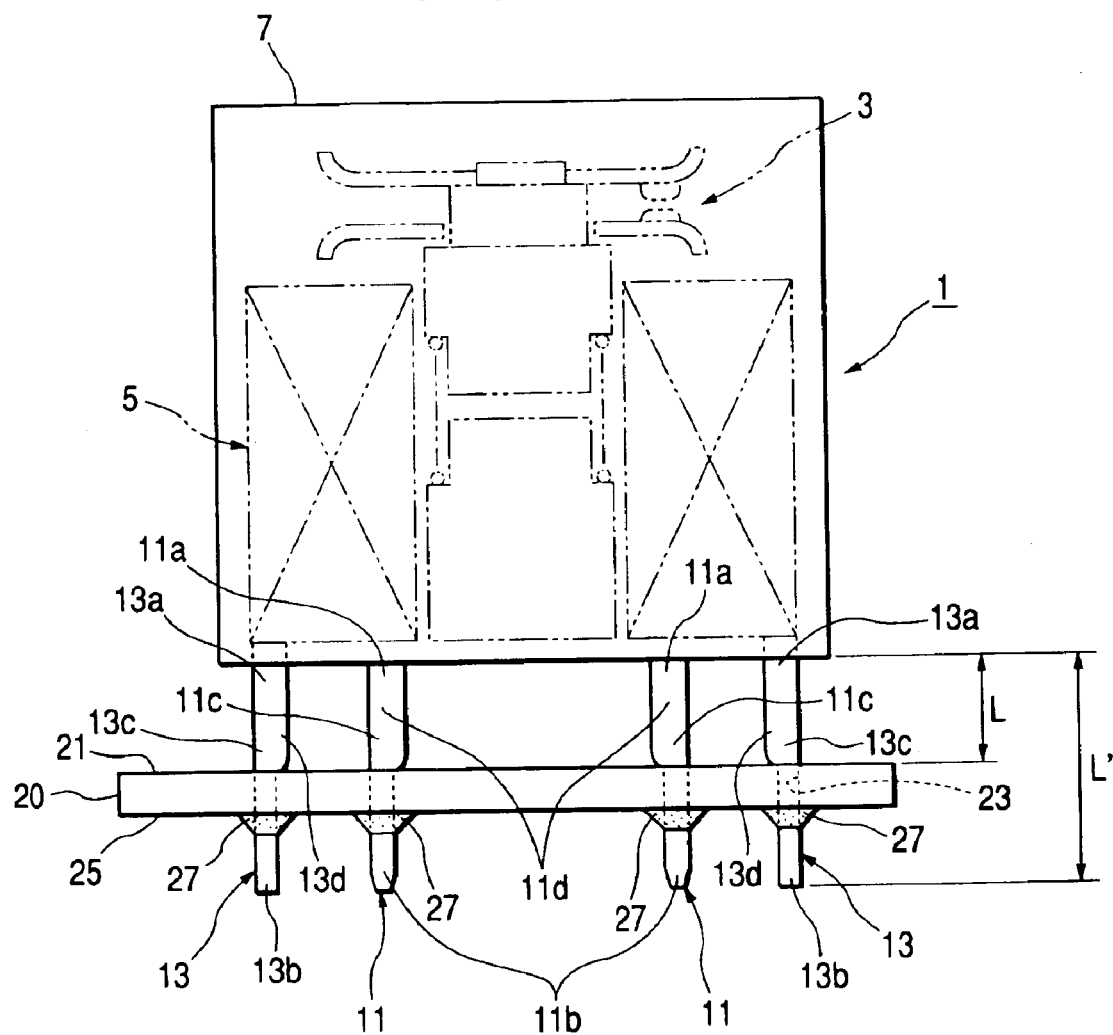
FIG. 2 is a front elevational view of a schematic constitution of another relay device according to a principle governing an embodiment of the invention.

As shown in a front elevational view of a schematic constitution of a relay device in FIG. 2 according to a principle governing another embodiment of the invention, instead of forming the space adjusting projections 9 at the four corners of the cover 7, space adjusting projections 11d and 13d protruding sideways in an expanded condition from the intermediate portions 11c and 13c of the terminals 11 and 13 may be formed, so that the edge portions of the space adjusting projections 11d and 13d on the sides of the front end portions 11b and 13b of the terminals 11 and 13 are positioned in an alienated condition by the length L from the base of the cover 7 in the height direction of the cover 7.

With the arrangement above, while the terminals 11 and 13 are being inserted front the side of the packaging surface 21 into the through-holes 23 of the wiring board 20, the edge portions on the sides of the front end portions 11b and 13b of the space adjusting projections 11d and 13d are brought into contact with the packaging surface 21, and the front end portions 11b and 13b of the terminals 11 and 13 inserted through the through-holes 23 and projected from the side of the pattern side 25 are joined to the wiring pattern (not shown) on the pattern side 25 with the solder 27.

Even with this arrangement, the same operation/working effect as that of the relay device 1 formed with the space adjusting projections 9 at the four corners of the cover 7 is achievable.

On condition that the intermediate portions 11c and 13c having a length of L in the height direction of the cover 7 can be secured in the portions of the terminals 11 and 13 between the base of the cover 7 of the relay device 1 mounted on the wiring board 20 and the packaging surface 21 in any other way, the space adjusting projections 9 and the space adjusting projections 11d and 13d of the terminals 11 and 13 at the four corners of the cover 7 may be omitted.

A description will now be given of a mounting structure fit for mounting the relay device 1 as described by reference to FIG. 1 on the packaging surface 21 of the wiring board 20 with reference to the drawings.

Figure 3:
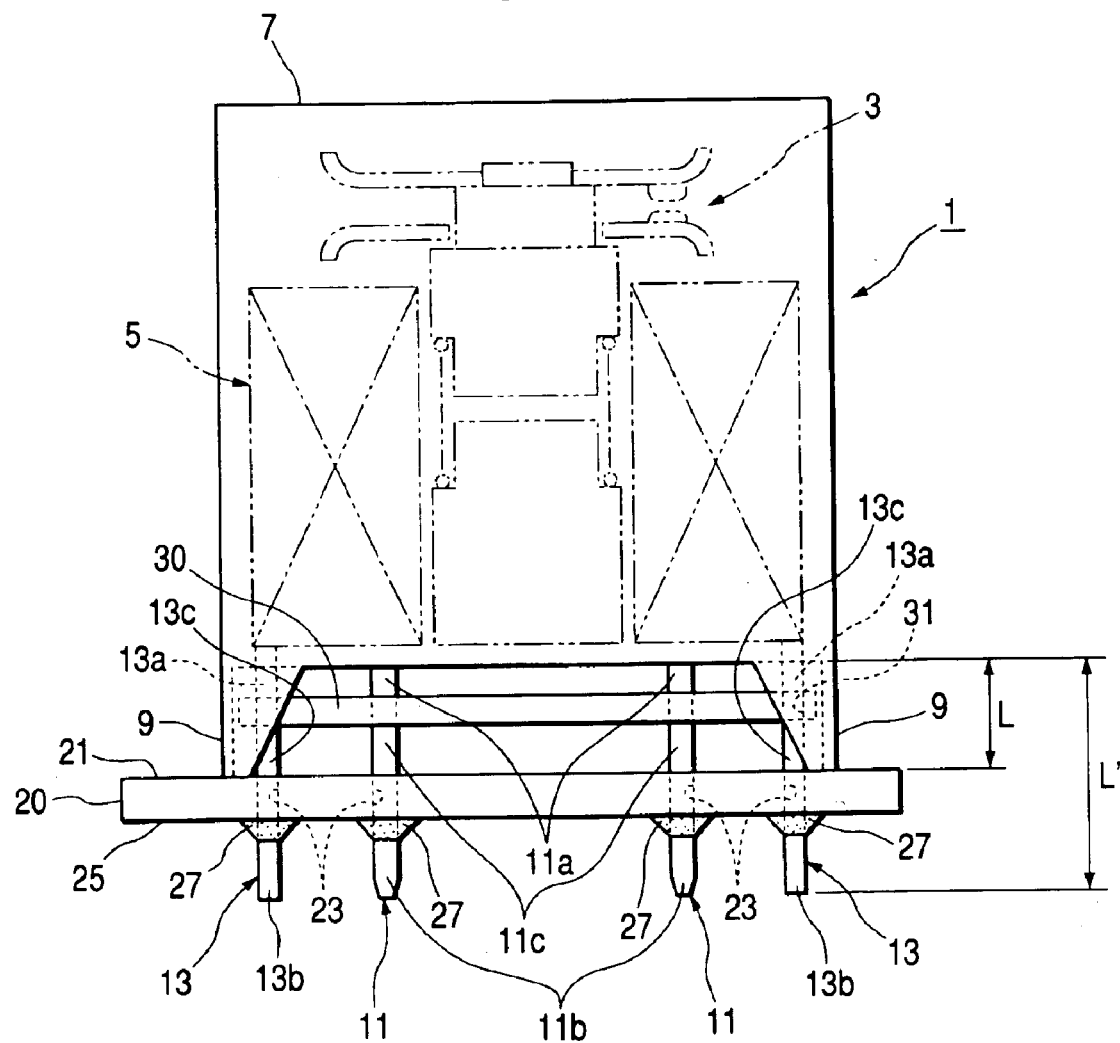
FIG. 3 is a front elevational view of a schematic constitution of a relay device according to a principle governing an embodiment of the invention.

FIG. 3 is a front elevational view of a relay device mounting structure according to a principle governing an embodiment of the invention, wherein like reference characters designate like members or corresponding parts throughout in FIG. 1 and a detailed description thereof will be omitted.

In the mounting structure according to this embodiment of the invention, the front end portions 11b and 13b of the terminals 11 and 13 are joined to the wiring pattern (not shown) on the pattern side 25 with the solder 27 and with the relay device 1 mounted on the wiring board 20, a heat radiating member 30 in the form of a simple flat plate is attached to the intermediate portions 11c and 13c of the terminals 11 and 13.

More specifically, the terminals 11 and 13 are fitted into mounting holes 31 bored through the heat radiating member 30 in line with the positions of the terminals 11 and 13 before the terminals 11 and 13 are inserted into the through-holes 23 bored through the wiring board 20, whereupon by inserting the terminals 11 and 13 into the through-holes 23 from the side of the packaging surface 21, the heat radiating member 30 is attached to the intermediate portions 11c and 13c of the terminals 11 and 13 so that the intermediate portions 11c and 13c are positioned between the packaging surface 21 of the wiring board 20 and the base of the cover 7 of the relay device 1.

Thus, at least part of the heat transmitted from the electromagnetic coil 5 of the relay device 1 to the cover 7 is transmitted to the heat radiating member 30 and radiated to the surrounding area and as the thermal expansion of the cover 7 is suppressed at least by the heat transmitted to the heat radiating member 30. Consequently, the external force of displacing the base end portions 11a and 13a in the height direction of the cover 7 is reduced at least and so is the stress countering the external force at least.

Therefore, the absorption of the stress by the deflection deformation of the intermediate portions 11c and 13c of the terminals 11 and 13 is readily realizable and the length L, of the intermediate portions 11c and 13c and the length L of the space adjusting projections 9 that are determined by the sectional areas of the terminals 11 and 13 and the material (hardness) of the terminals 11 and 13 can be shortened relatively to the extent that flexibility necessary for the intermediate portions 11c and 13c of the terminals 11 and 13 to absorb the stress becomes reducible, so that the size of the relay device 1 also becomes reducible.

When the relay device 1 is mounted on the packaging surface 21 of the wiring board 20 as described by reference to FIG. 2, the heat radiating member 30 of FIG. 3 is attached to the portions of the terminals 11 and 13 somewhere from the space adjusting projections 11d and 13d to the base end portions 11a and 13a, whereby the same operation/working effect as what is shown in FIG. 3 is achievable.

Figure 4:
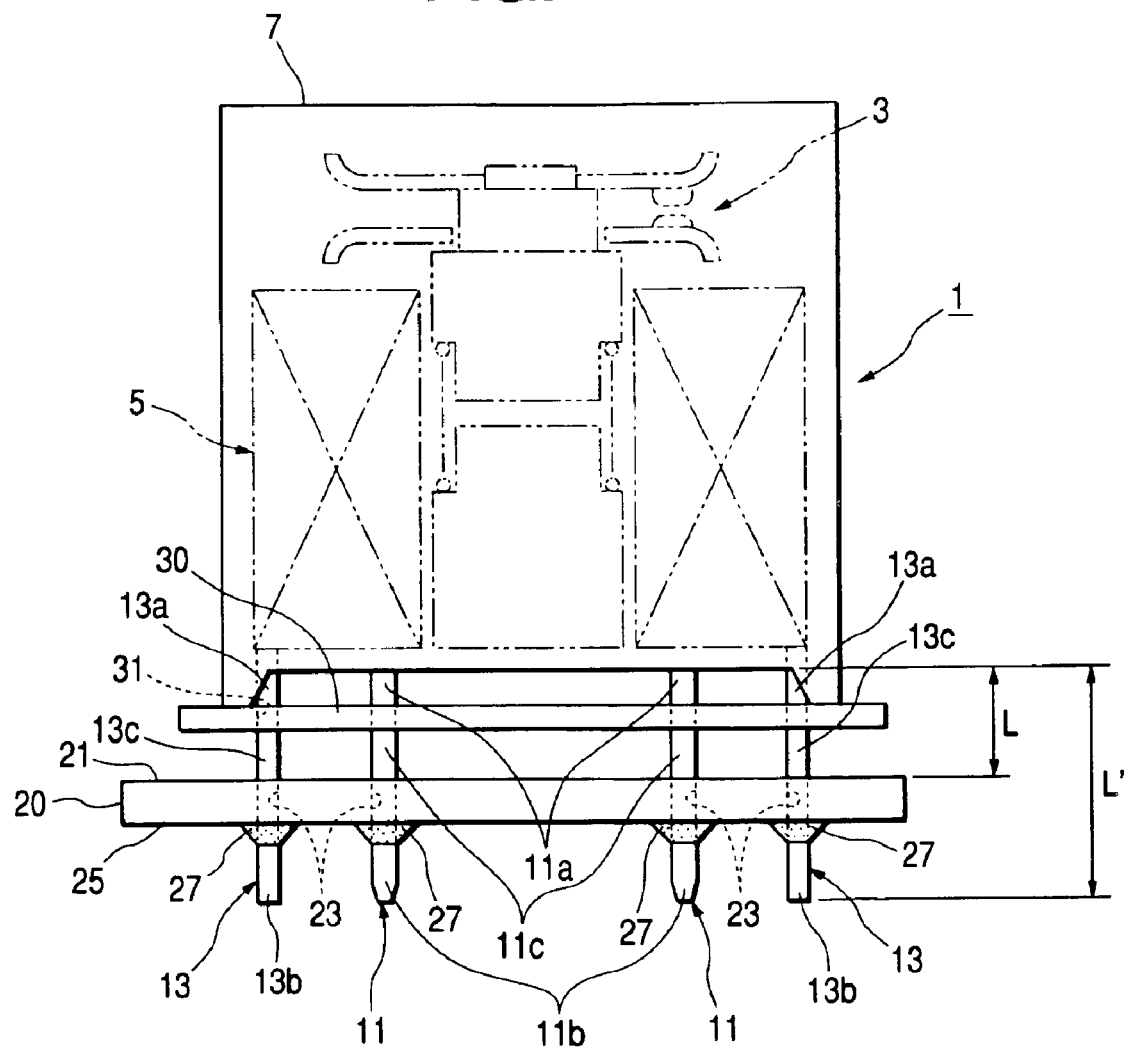
FIG. 4 is a front elevational view of a schematic constitution of another relay device according to a principle governing an embodiment of the invention.

On condition that the intermediate portions 11c and 13c having a length of L in the height direction of the cover 7 can be secured in the portions of the terminals 11 and 13 between the base of the cover 7 of the relay device 1 and the packaging surface 21 by any other optional means, the space adjusting projections 9 and the space adjusting projections 11d and 13d of the terminals 11 and 13 at the four corners of the cover 7 may be omitted as shown in a front elevational view of a relay device according to another embodiment of the invention referred to in FIG. 4. Moreover, the heat radiating member 30 may be positioned between the cover 7 and the wiring board 20 over the whole cover 7.

With the arrangement above, at least part of the heat transmitted from the electromagnetic coil 5 of the relay device 1 to the cover 7 is transmitted to the heat radiating member 30 and radiated to the surrounding area and as the thermal expansion of the cover 7 is suppressed at least by the heat transmitted to the heat radiating member 30. Consequently, the external force of displacing the base end portions 11a and 13a in the height direction of the cover 7 is reduced at least and so is the stress countering the external force at least.

Therefore, the absorption of the stress by the deflection deformation of the intermediate portions 11c and 13c of the terminals 11 and 13 is readily realizable further and the length L of the intermediate portions 11c and 13c that is determined by the sectional areas of the terminals 11 and 13 and the material (hardness) of the terminals 11 and 13 can be shortened further relatively to the extent that flexibility necessary for the intermediate portions 11c and 13c of the terminals 11 and 13 to absorb the stress becomes reducible further, so that the size of the relay device 1 also becomes reducible further.

In the case of the mounting structure shown in FIG. 3 as well as what is shown in FIG. 4 according to the embodiment of the invention or in the case of the mounting structure as the modified embodiment of the invention referred to in FIG. 3 wherein the heat radiating member 30 is attached to the terminals 11 and 13 of the relay device 1 of FIG. 2, the heat radiating member 30 may he made of material having a thermal conductivity higher than that of the cover 7. In this case, as the heat generated by the electromagnetic coil 5 of the relay device 1 is transmitted to the heat radiating member 30 more efficiently than what is directed to the cover 7 and radiated to the surrounding areas, the thermal expansion of the cover 7 is suppressed or prevented further and this actually contributes to not only further facilitating the absorption of the stress due to the deflection deformation of the intermediate portions 11c and 13c of the terminals 11 and 13 but also reducing the size of the relay device 1 by shortening the length L of the intermediate portions 11c and 13c of the terminals 11 and 13 and the length L of the space adjusting projections 9 of the cover 7.

When the heat radiating member 30 is constituted of the simple flat plate according to the embodiments of the invention referred to in FIGS. 3 and 4, it is advantageous to form the heat radiating member 30 with a material having a thermal expansion coefficient lower than that of the cover 7.

The reason for the above fact is that even though the electromagnetic coil 5 of the relay device 1 generates heat with the front end portions 11b and 13b of the terminals 11 and 13 joined to the wiring board 20 with solder, the degree of the thermal expansion of the heat radiating member 30 constituted of such a simple material that has a thermal expansion coefficient lower than that of the thermal expansion coefficient of the cover 7 in case where the heat radiating member 30 is not attached to the terminals 11 and 13.

In other words, the reason for the above fact is that external force exceeding the external force generated by the thermal expansion of the cover 7 when the heat radiating member 30 is not attached to the terminals 11 and 13 is suppressed or prevented from being newly generated in the intermediate portions 11c and 13c of the terminals 11 and 13. Therefore, a greater external force as the source of stress that cannot satisfactorily absorbed by the deflection deformation of the intermediate portions 11c and 13c is suppressed or prevented, whereby the electrical connection between the terminals 11 and 13 and the wiring board 20 by means of the solder 27 is kept in good condition.

However, in case where a heat radiating member is provided to each combination of terminals 11 and 13 whereby to prevent the interference of the heat radiating members with each other thus thermally expanded because of the heat transmitted from the terminals 11 and 13 to the heat radiating member or the heat transmitted from the terminals 11 and 13 and the cover 7 thereto in the case of the embodiment of the invention of FIG. 4, or otherwise in case where the adjoining terminals 11 and 13 are prevented from contacting each other, it is not always necessary to select the material for use in forming the heat radiating member deliberately with the consciousness of whether the thermal expansion coefficient is set high or low with respect to the heat radiating member.

Even in case where the heat radiating member 30 is not attached to the terminals 11 and 13, the case has the following meaning in that the space adjusting projections 9 at the four corners of the cover 7 and the space adjusting projections 11d and 13d between the terminals 11 and 13 are used to secure the length L between the base of the relay device 1 mounted on the wiring board 20 and the cover 7.

More specifically, unless the space adjusting projections 9, 11d and 13d exist, the electromagnetic coil 5 is arranged fairly close to the wiring board 20, so that the heat radiated from the electromagnetic coil 5 to the surrounding area tends to be readily transmitted to the soldered portions. Under the influence, the electrical connection between the relay device 1 and the wiring board 20 tends to be deteriorated because of the deterioration of and the deformation of the soldered portions because of the heat of the solder 27 and the thermal expansion of the wiring board 20.

However, the space adjusting projections 9, 11d and 13d exist so as to secure the length L between the base of the relay device 1 and the cover 7 whereby to alienate the electromagnetic coil 5 from the wiring board 20 to a certain degree so that the heat radiated from the relay device 1 and transmitted to the soldered portions of the wiring board 20 is reduced. Consequently, the deterioration of the electrical connection because of the heat between the relay device 1 and the wiring board 20 can be suppressed and prevented.

Therefore, the absence of the heat radiating member 30 and the presence of the space adjusting projections 9, 11d and 13d simply add a meaning to this mounting structure.

As set forth above, the invention is applicable to not only the relay device 1 mounted on the packaging surface 21 of the wiring board 20 of the relay box of a vehicle and the mounting structure but also a relay device having a cover which contains a heat generating element and is made of heat expanding material and having a plurality of terminals for electrical connection whose base end portions are drawn outside from the cover. Accordingly, the invention is needless to say applicable to a mounting structure with respect to the wiring board of such a relay device in the broad sense.

Consequently, according to the present invention, even when the external force of displacing the terminals in the direction perpendicular to the extending direction of the terminals is applied from the cover to the base end portions of the terminals by the thermal expansion of the cover due to the heat generated by the heating generating element of the relay device, the stress countering the external force is absorbed by the deflection deformation of the terminal portions positioned closer to the cover than the wiring board so as to prevent the stress from acting on the solder used to electrically connect the terminals to the wiring board. The stress countering the external force of deforming the terminals, the external force originating from the thermal expansion of the cover, is absorbed for certain without damaging the electrical connections between the terminals and the wiring board. Thus, it is possible to join the terminals to the wiring board with the solder having extremely high rigidity after hardening by cooling and without containing Pb.

Further, according to the present invention, the front ends of the space adjusting projections are brought into contact with the wiring board when the front end portions of the terminals are joined to the wiring board with the solder to secure the required length in the terminal portions positioned closer to the cover than the wiring board. The predetermined flexibility necessary for the deflection deformation to absorb the stress countering the external force produced in the base end portions of the terminals is provided for the terminal portions positioned closer to the cover than the wiring board for certain.

Further, according to the invention, the front ends of the space adjusting projections are brought into contact with the wiring board when the front end portions of the terminals are joined to the wiring board with the solder to secure the required length in the terminal portions positioned closer to the cover than the wiring board. The predetermined flexibility necessary for the deflection deformation to absorb the stress countering the external force produced in the base end portions of the terminals is provided for the terminal portions positioned closer to the cover than the wiring board for certain.

According to the invention, when the heat generating element generates heat with the front end portions of the terminals joined to the wiring board with the solder in the relay device according to the invention as described in claim 4, the external force exceeding the external force produced by the thermal expansion of the cover without attaching the heat radiating member to the terminals is suppressed or prevented from newly produced in the base end portions of the terminals and the simple heat radiating member is attached to the terminals, whereby greater external force as the source of new stress that cannot completely be absorbed by the deflection deformation of the terminal portions positioned closer to the cover than the wiring board is suppressed or prevented, so that good connections between the terminals and the wiring board can be maintained.

What is claimed is:

1. A relay device mounting structure comprising:

a cover made of heat-expanding material for containing a heat generating element;

a wiring board; and a plurality of terminals, base end portions being defined by one ends of the terminals and projecting from different places of the cover, respectively, and front end portions being defined by the other ends of the terminals and being joined to different places on the wiring board with solder which does not contain Pb, respectively, wherein the terminals have a length between the base end portions and the front end portions so that stress caused by a displacement between the base end portions due to heat generated by the hear generating element is absorbed at the front end portions by utilizing a predetermined flexibility which the terminals have, and wherein the length is determined based a sectional area of the terminal.

2. The relay device mounting structure according to claim 1, further comprising a space adjusting projection, wherein the space adjusting projecting is abutted against the wiring board when the terminals are joined to the wiring board so as to provide the terminals of the length between the cover and the wiring board.

3. The relay device mounting structure according to claim 2, wherein the space adjusting protection extends from the cover along a terminal extending direction.

4. The relay device mounting structure according to claim 2, wherein the space adjusting projection is formed at at least one of the terminals.

5. The relay device mounting structure according to claim 4, wherein the space adjusting projection is formed by changing thickness of the terminal.

6. The relay device mounting structure according to claim 1, wherein the length is determined based the sectional area and material of the terminal.

7. The relay device mounting structure according to claim 1, wherein the heat generating element is an electromagnetic coil for switching contact.

8. The relay device mounting structure according to claim 1 further comprising a heat radiating member attached to the terminal between the cover and the wiring board.

9. The relay device mounting structure according to claim 8, wherein the heat radiating member is made of simple material whose thermal expansion coefficient is lower than that of the cover, and the heat radiating member is attached to the terminals by passing the terminals through the heat radiating member.

* * * * *